US007851812B2

(12) United States Patent
Behringer et al.

(10) Patent No.: US 7,851,812 B2
(45) Date of Patent: Dec. 14, 2010

(54) HOUSED OPTOELECTRONIC COMPONENT

(75) Inventors: Martin Rudolf Behringer, Regensburg (DE); Harald Feltges, Regensburg (DE); Thomas Hoefer, Lappersdorf (DE); Frank Moellmer, Matting b. Pentling (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 246 days.

(21) Appl. No.: 11/678,523

(22) Filed: Feb. 23, 2007

(65) Prior Publication Data

US 2007/0200130 A1    Aug. 30, 2007

(30) Foreign Application Priority Data

Feb. 24, 2006  (DE) .............. 10 2006 008 793

(51) Int. Cl.
*H01L 33/00* (2010.01)
(52) U.S. Cl. .......... 257/88; 257/E33.056; 257/E33.073; 257/E33.045; 257/E33.059; 257/E33.07; 257/E21.002; 257/E33.057; 257/E33.061; 313/487
(58) Field of Classification Search .............. 257/88, 257/100, E33.045, E33.059, E33.07, E21.002, 257/E33.057, E33.061, 99, E33.056, E33.073; 313/487
See application file for complete search history.

(56) References Cited

U.S. PATENT DOCUMENTS

| 4,625,229 | A | * | 11/1986 | Maier ......................... 257/716 |
| 4,926,545 | A | * | 5/1990 | Pimpinella et al. ............. 29/832 |
| 4,975,762 | A | * | 12/1990 | Stradley et al. ............. 257/660 |
| 5,117,279 | A | * | 5/1992 | Karpman ..................... 257/793 |
| 6,054,008 | A | | 4/2000 | Chan et al. |
| 6,459,130 | B1 | | 10/2002 | Arndt |
| 6,583,444 | B2 | * | 6/2003 | Fjelstad ....................... 257/82 |
| 6,759,266 | B1 | | 7/2004 | Hoffman |
| 6,798,810 | B2 | | 9/2004 | Albrecht |
| 6,893,169 | B1 | | 5/2005 | Exposito |
| 7,045,956 | B2 | * | 5/2006 | Braune et al. ............... 313/512 |
| 7,057,255 | B2 | * | 6/2006 | Yamabayashi et al. ...... 257/461 |
| 7,446,347 | B2 | * | 11/2008 | Bogner et al. ................. 257/99 |
| 2002/0003822 | A1 | | 1/2002 | Wipiejewski |
| 2006/0076571 | A1 | * | 4/2006 | Hsieh et al. .................... 257/99 |
| 2007/0120135 | A1 | * | 5/2007 | Soules et al. .................. 257/98 |
| 2007/0182299 | A1 | * | 8/2007 | Ouderkirk et al. ........... 313/110 |
| 2007/0190747 | A1 | * | 8/2007 | Humpston et al. .......... 438/460 |
| 2007/0205425 | A1 | * | 9/2007 | Harada ........................ 257/98 |

(Continued)

FOREIGN PATENT DOCUMENTS

DE        195 36 454 A1    4/1997

(Continued)

OTHER PUBLICATIONS

3M™ Polyimide Film Tape 5413, 1995-2006, [online], [retrieved on Feb. 23, 2007] Retrieved from the Internet: <URL:http://products3.3m.com/catalog/us/en001/manufacturing_industry/specialty_tapes/node_GSMZOZIN9Obe/root_GSTIT4S9TCgv/vroot_GSNYTMLW46ge/gvel_T5HX66D589gl/theme_us_specialtytapes_3_0/command_AbcPageHandler/output_html&WT.mc_id=keymatch>, 2 pp.

(Continued)

*Primary Examiner*—Alexander O Williams
(74) *Attorney, Agent, or Firm*—Fish & Richardson P.C.

(57) ABSTRACT

An electronic device according to the invention includes a housing, a recess containing an optoelectronic component, and a film including a polyimide, which is over the recess covering the optoelectronic component.

34 Claims, 1 Drawing Sheet

U.S. PATENT DOCUMENTS

| | | | |
|---|---|---|---|
| 2009/0095969 A1* | 4/2009 | Kotani et al. | 257/98 |
| 2009/0114905 A1* | 5/2009 | Ottermann et al. | 257/40 |
| 2009/0168453 A1* | 7/2009 | Koike et al. | 362/611 |

FOREIGN PATENT DOCUMENTS

| | | |
|---|---|---|
| DE | 199 45 134 A1 | 5/2001 |
| DE | 100 26 262 A1 | 12/2001 |
| DE | 10 2004 005 269 A1 | 6/2005 |
| WO | WO 01/22495 A1 | 3/2001 |
| WO | WO 02/13334 A2 | 2/2002 |
| WO | WO 2005/055379 A1 | 6/2005 |

OTHER PUBLICATIONS

3M™ Low Static Polyimide Film Tape 5419 Gold, 7/8 in ×36 yd 2.7 mil, 9 per case Boxed, 1995-2006, [online], [retrieved on Feb. 23, 2007] Retrieved from the Internet: <URL:http://products3.3m.com/catalog/us/en001/electronics_mfg/electronic_handling/node_GS4ZDT73C0gs/root_GSTIT4S9TCgv/vroot_8088DWF29Kge/bgel_ZR6XNK3DPRbi/gvel_RO89J1RODXgl/theme_us_ehpd_3_0/command_AbcPageHandler/output_html>, 1 p.

* cited by examiner

HOUSED OPTOELECTRONIC COMPONENT

BACKGROUND

This invention pertains to encapsulated electronic devices.

Electronic devices may contain optoelectronic components that must be protected against harmful effects. Damage may occur while processing, transporting, handling and/or operating the optoelectronic component.

Such harmful effects may be caused by contamination in the form of dust or humidity or by mechanical damage, such as scratches or print marks.

SUMMARY

This invention has the objective to provide an electronic device, which protects the components in the device. This objective is achieved by an electronic device having a housing that forms a recess in which an optoelectronic component is located and a film over the recess, wherein the film includes polyimide.

An electronic component according to one embodiment includes, in particular, a housing that has a recess containing the optoelectronic component. A polyimide-containing film is applied over the recess so that a cavity may be formed and the optoelectronic component is at least partially enclosed in the recess.

A polyimide denotes, for example, a polymer with imide groups as the major structures of the main polymer chain, wherein the imide groups may be linear or cyclic. The polymer may furthermore exhibit other functional groups as components of the polymer chain, such as, amide, ester, and/or ether groups.

Polyimides may be characterized by high stability and strength over a wide range of temperatures. In some embodiments, the polyimide is temperature-resistant over a temperature range of −75° C. to +260° C. In some embodiments, the polyimide is temperature-resistant up to a temperature of 370° C. In this regard it may be beneficial if the polyimide exhibits no melting point and is highly flame-retardant.

In some embodiments, the polyimide is highly resistant against heat-related deformation, in particular exhibiting a shrinkage of not more than 0.03% at a temperature of 250° C. Due to its high temperature and deformation resistance, a film containing a polyimide can be exposed to high temperatures during the manufacturing and processing of the electronic device. The device is typically exposed to high temperature environments during the soldering process. During reflow soldering, for example, the device may be exposed to a temperature of up to 260° C. for a period of five to ten seconds.

The polyimide-containing film is attached to the housing structure in such fashion that the recess and the film create an enclosed cavity. This means that the film defines a hollow space with at least parts of the recess. In some embodiments, the optoelectronic component is installed inside the recess in a fashion that prevents it from coming into direct mechanical contact with the film.

In one embodiment of the electronic component, the recess has at least sections of reflective areas. The recess may be designed as a reflector pot. Alternatively, the recess may not be reflective at all.

In some embodiments of the electronic device, the film is attached to the housing by an adhesive layer. In this case, the housing can have a surface surrounding the recess and to which the adhesive is applied. In particular, the surface is flat, or not curved, providing a level connecting surface for the film.

The adhesive layer and the film can cover the surrounding surface in such fashion that a section of the film enclosing the recess is attached to the housing. This allows the cavity to be completely enclosed by the film and the recess.

In some embodiments, the film and the adhesive layer prevent dust and other micro-particles as well as fluids and vapors from entering the cavity or at least strongly reduce the likelihood of contaminants entering the cavity. This allows for processing or operating the electronic device in environments that could damage the optoelectronic component. Such environments may be present in a soldering process, such as reflow soldering.

In some embodiments the adhesive layer is designed so that the cavity is not hermetically sealed. This may be advantageous when the electronic device is processed in environments where the device is exposed to major temperature fluctuations, e.g., in the soldering process.

In a cavity that is non-hermetically sealed by the film and the adhesive layer, overpressurization or underpressurization of the cavity in the presence of potential temperature fluctuations can be prevented or reduced, which may otherwise damage the optoelectronic component. The adhesive layer, for example, may be designed to allow gases to flow into or out of the cavity.

In some embodiments of the electronic device, the film has a first layer including the polyimide as well as a second layer. The second layer contains a type of adhesive and is applied to the housing. The second, adhesive-containing layer of the film can facilitate and improve the application and adhesion of the film to the housing.

In some embodiments the adhesive layer contains a silicone adhesive or is made of a silicone adhesive.

Silicone adhesives are highly temperature-resistant, especially within a temperature range between about −75° C. and 260° C., or even up to 370° C. A silicon adhesive can prevent the delamination of the film due to the temperature-caused degradation of the adhesive at high temperatures. Alternatively, a silicone-based adhesive, which additionally contains epoxide or an epoxy-based adhesive may also be used.

In some embodiments of the electronic device, the film or the first layer of the film is a polyimide. The polyimide may contain a poly-(diphenyloxide-pyromellithimide) or to be made of a poly-(diphenyloxide-pyromellithimide).

In a further embodiment, the polyimide film is available as Kapton™ polyimide film, which is available from DuPont™, Circleville, Ohio.

In another embodiment of the electronic device, the film exhibits a thickness of ten to a several hundred μm. A small thickness may prove beneficial to the transmitting properties of the film in regard to radiation. On the other hand, a greater thickness will be beneficial in regard to the mechanical stability and therefore in regard to the protection against mechanical damage to the optoelectronic component. In some embodiments, the film has a thickness of about 70 μm.

In some embodiments of the electronic device, the film is permanently attached to the housing, especially during the storage and the operation of the electronic device. Permanently means that the film, a sealing layer holding the film to the housing or the housing must be broken to remove the film from the housing. This provides uninterrupted and permanent protection for the optoelectronic component.

In an embodiment of the electronic device, the film is placed in the radiation path of the optoelectronic component, i.e. the radiation enters the film at a first side of the film and exits the film on the second side of the film. In this context it may be advantageous for the film to be transparent to radiation. Transparent means that the film allows at least 1%, such as at least 50%, for example, at least 90% of the intensity of the radiation that impinges on the first side to pass through the film.

In one embodiment of the electronic device, the film is transparent to radiation with a wavelength between about 800 nm and 900 nm, such as a wavelength between about 840 nm and 860 nm, or having a wavelength of about 850 nm. This type of film with a transparency for a limited wavelength range may specifically be used as a spectrum filter.

In some embodiments, the film has a refractive index lower than the refractive index of glass. This allows the reduction of refractive losses at the boundaries of the film in contrast to the case when light emitted by the optoelectronic component passes through an element which comprises glass or is made of glass.

In some embodiments, the film is birefringent. The film can act as a polarizer or phase shifter, e.g., as a waveplate, for the radiation. Alternatively, the film may have no polarizing effect on the radiation.

In one embodiment of the electronic device, the optical properties of the film, especially the transparency, are temperature-independent in a range between about $-40°$ C. and $+100°$ C.

In one embodiment of the electronic device, the film is antistatic. That is, the film exhibits a static charge of less than 150 V, preferably less than 50 V due to mechanical causes, e.g., friction with the same or another material. This means that the film may protect the optoelectronic device from electrostatic discharges (ESD).

In one embodiment of the electronic device, the optoelectronic component is a radiation-emitting optoelectronic component or a radiation-detecting optoelectronic component. The optoelectronic component may also have a combination of radiation-emitting and radiation-detecting optoelectronic components.

In some embodiments of the electronic device, the electronic device includes in addition to a first optoelectronic component at least one second optoelectronic component. The first optoelectronic component may have a radiation-emitting optoelectronic or a radiation-detecting optoelectronic component, and furthermore, the second optoelectronic component may also have a radiation-emitting optoelectronic or a radiation-detecting optoelectronic component.

In some embodiments of the electronic component, the radiation-detecting optoelectronic component is a photo diode, a photo transistor, or a photo IC.

In some embodiments of the electronic component, the radiation-emitting optoelectronic component is a radiation-emitting semiconductor diode or a semiconductor laser diode. The semiconductor laser diode may be an edge-emitting semiconductor diode or a Vertical-Cavity Surface-Emitting Laser diode (VCSEL).

In one embodiment of the electronic device, the housing is surface-mountable. In this case, the electronic component has electrical contacts on the outside. Alternatively, the electronic device may also be a wired electronic device, which may be soldered via through-connections to a suitable substrate.

In some embodiments the electronic component, the housing contains or is made of a synthetic material.

A process for encapsulating an electronic device can include the following steps. An electronic component with a housing having a recess in which an optoelectronic component is located is supplied. A film including polyimide is applied over the recess so that a cavity is created.

In some embodiments of the process, the process includes supplying a film strip including a polyimide and removing a piece of film from the film strip by cutting and/or stamping prior to applying the film over the recess. The film strip, from which the film is removed, can provide a simplified process for the application of film to a large number of housings, which may be provided on a strip or a belt.

The film pieces that have been removed from the film strip can be picked up by a vacuum pipette and applied to the recess. This allows for accurate positioning of the film on the housing.

In some embodiments of the process, the housing is attached to a substrate after the film has been applied. The substrate may be a circuit board or a different structure providing an electrical connection for the housing. The application and the electric contacting of the electronic device may take place via a soldering process, in particular, a reflow soldering process. The electrical contacts may also be applied via an electrically conductive adhesive. The film can protect the optoelectronic component from vapors or fluids that are generated during the application and contacting process, and which may negatively affect the optoelectronic component.

In some embodiments, the film is removed from the housing before the electric device is operated.

Additional advantages and advantageous embodiments and advancements of the invention result from the embodiments described in the only FIGURE submitted with the application.

BRIEF DESCRIPTION OF THE FIGURE

The FIGURE shows a schematic cross-sectional view of an electronic device.

DETAILED DESCRIPTION

Figure 1:
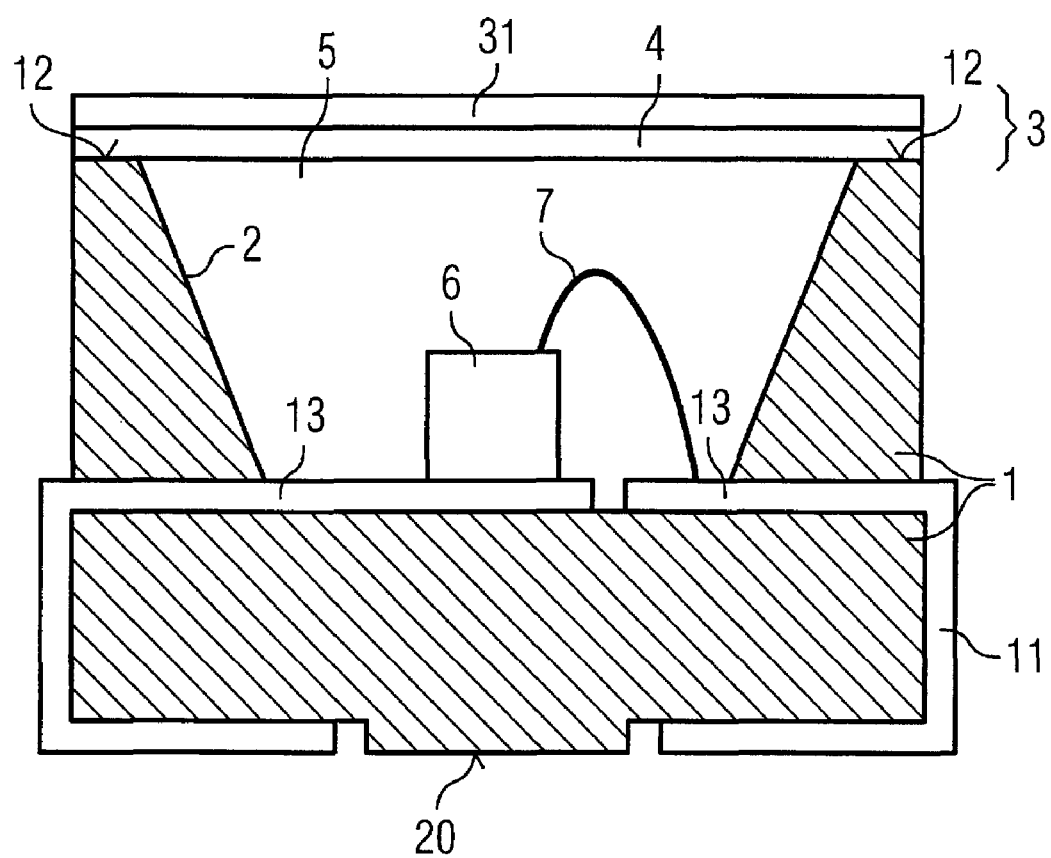

An embodiment pursuant to the FIGURE is an electronic device having a housing 1 with a recess 2. The housing 1 is surface-mountable. The housing 1 is, for example, an injection-molded housing 1 made of a type of plastic material, such as thermoplastic, into which a lead frame 11 is integrated. The lead frame 11 is integrated into the housing 1 in such fashion that the recess 2 allows the one or more optoelectronic devices 6 to be located in a number of different locations within the housing 1. The optoelectronic devices 6 have an electric connection, such as a bond wire 7, that can be connected to one of a number of locations 13 on an electrically conductive area of the lead frame 11. In some embodiments, the recess 2 has the shape of a truncated cone. Alternatively, the shape of the recess 2 may be other than a cone, such as a cylinder or a cube or a shape exhibiting a combination of truncated cones, cylinders and cubes. The housing 1 is furthermore designed in such fashion as to have around the recess 2 a continuous, flat or non-curved surface 12 parallel to the bottom surface of the recess 2.

Applied above the recess 2 is a film 3 with a first polyimide layer 31 and a second adhesive layer 4, wherein the film 3 covers the recess 2, thereby creating the cavity 5 being defined by the film 3 and recess 2. The film 3 extends past the recess 2 to cover at least part of the surface 12. The adhesive layer 4 contacts the polyimide layer 31 of the film 3 and the surface 12.

In some embodiments, the polyimide of the layer 31 is a poly-(diphenyloxide-pyromellithimide) and the adhesive layer 4 is a silicone adhesive. The film 3 is designed so that the layer 31 and the adhesive layer 4 are processed into a polyimide film adhesive tape, which is available from 3M, for example. The thickness of the film 3 in some embodiments is about 70 µm.

In order not to negatively affect the upstream processing and handling steps of the electronic device, the film can have a lateral expanse relative to the lateral dimension of the housing so that the film does not extend more than 50 μm past the borders of the housing, especially past the surface 12. The lateral dimension indicates the dimension of the film 3 or the housing 1 on a plane parallel to the mounting surface 20 of the housing. For this purpose, a suitable piece of film 3 can be stamped out of the film strip and, using a vacuum pipette, be applied to the surface 12 of the housing 1, which allows for a high accuracy regarding the size of the film and the positioning of the film 3 on the housing 1.

Due to the fact that film 3 is easy to process, the film 3 proves advantageous in regard to handling and processing cost in comparison to attaching a glass plate to the housing with an additional adhesive layer, for example. The film 3 simultaneously provides a protective function for the optoelectronic component 6 comparable to that of a glass plate.

Defined by the film 3 and the recess 2, the electronic device has a cavity 5, which is closed off by the adhesive layer 4 on the surface 12 surrounding the recess. The thickness of the adhesive layer can be such that the cavity is not hermetically sealed. This allows for pressure compensation in the cavity in the event of pressures less than or greater than ambient pressure or atmospheric pressure, which may occur due to temperature fluctuations in the device and/or in the surrounding environment.

Due to the high resistance of the film 3 against heat and chemicals due to the polyimide-containing layer 31, the cavity 5 is also protected from solvents and other chemicals under conditions such as high temperature and vapor exposure. The film 3 is stable in a temperature range between about −75° C. and +260° C. Alternatively, the film 3 may also be stable at temperatures of up to 370° C. Such high temperature conditions may occur when the electronic device is soldered to a substrate, preferably with a reflow soldering process. Minor shrinkage of the film 3 at high temperatures, e.g., 0.03% at 250° C. does not significantly deform the film 3. This prevents delamination of the film 3 from surface 12.

The film 3 may also be antistatic. This means in particular that the film 3 does not build up static charges during its handling and processing, which provides additional protection for the optoelectronic component. The film 3 can provide protection up to a breakdown voltage of 7 kV.

In some embodiments, the optoelectronic component 6 is a vertical-cavity surface-emitting laser diode (VCSEL). VCSEL-diodes are characterized by the fact that the radiation is emitted perpendicular to its semiconductor layer sequence, and are described in the publications U.S. Publication No. 2003/179802, which was filed on Jul. 31, 2001, and U.S. Pat. No. 6,584,135, which was filed May 24, 2001, whose disclosure content is here included by reference. To protect the VCSEL-diode, the optoelectronic component 6 may also exhibit one or multiple ESD protection diodes in parallel, e.g., semiconductor diodes, photo diodes or photo transistors.

Alternatively, the semiconductor layers of the VCSEL-diode may exhibit one or multiple integrated ESD-protective diodes, e.g., as described in publications DE 102004005269 B4 and DE 19945134 A1, whose disclosure content is included by reference. The electrical contacts of the VCSEL-diode are attached from the bottom of the VCSEL-diode directly to an electric contacting option 13 of the conductor frame 11 and from the top of the VCSEL-diode via a bond wire 7 to another electric contacting option 13.

The VCSEL-diode exhibits maximum emission at a wavelength of 850 nm. The VCSEL-diode has an edge length of about 250 μm and a thickness of about 150 to 200 μm. In lateral direction, the housing 1 exhibits an edge length of about 3.2+/−0.2 mm and about 2.8+/−0.2 mm. The housing height is about 1.9+/−0.2 mm. The depth of the cavity 5 dictated by the recess 2 in the housing 1 is about 0.8+/−0.1 mm.

The description based on the embodiments does not limit the invention to said embodiments. Instead, the invention includes any new characteristic as well as any combination of characteristics, which especially include any combination of characteristics in the patent claims, even if such characteristic or such combination is not indicated explicitly in the patent claims or embodiments.

What is claimed is:

1. An electronic device, comprising:
   a housing having a recess containing an optoelectronic component; and
   a film including a polyimide applied over the recess to define a cavity in which the component is located and to at least partially enclose the optoelectronic component between the film and the housing, wherein the film including the polyimide is a piece of a strip of film and the housing is made of a synthetic material.

2. The device according to claim 1, wherein an adhesive layer attaches the film to the housing.

3. The device according to claim 1, wherein the film includes at least a first layer including the polyimide and a second layer, wherein the second layer is an adhesive layer and is attached to the housing.

4. The device according to claim 3, wherein the adhesive layer is a silicone adhesive.

5. The device according to claim 1, wherein the polyimide is a poly-(diphenyloxide-pyromellithimide).

6. The device according to claim 1, wherein the film has a thickness of about 70 micrometers.

7. The device according to claim 1, wherein the film is configured to be on the housing while the device is operated.

8. The device according to claim 1, wherein the film is located in a radiation path of the optoelectronic component.

9. The device according to claim 1, wherein the film is transparent to radiation.

10. The device according to claim 9, wherein the film is transparent to radiation having a wavelength between about 500 nm to 900 nm.

11. The device according to claim 10, wherein the transparency of the film is temperature-independent between about −40° C. and 100° C.

12. The device according to claim 1, wherein the film has antistatic properties.

13. The device according to claim 1, wherein the optoelectronic component is a radiation-detecting optoelectronic component or a radiation-emitting optoelectronic component.

14. The device according to claim 13, wherein the optoelectronic component is a radiation-detecting optoelectronic component and the radiation-detecting optoelectronic component is a photo diode, a photo transistor or a photo IC.

15. The device according to claim 13, wherein the radiation-emitting electronic component is a radiation-emitting semiconductor diode or semiconductor laser diode.

16. The device according to claim 15, wherein the radiation-emitting electronic component is a semiconductor laser diode, wherein the semiconductor laser diode is a vertical-cavity surface-emitting laser (VCSEL) diode.

17. The device according to claim 1, wherein the housing is surface-mountable.

18. A process for encapsulating an electronic device, comprising:

supplying an electronic component with a housing having a recess containing an optoelectronic component; and applying a film including polyimide over the recess so that the optoelectronic component is at least partially enclosed in a cavity defined by the film, wherein the film including the polyimide is a piece of a strip of film and the housing is made of a synthetic material.

19. The process according to claim 18, further comprising:

before applying the film, supplying the strip of film containing the polyimide; and removing the piece from the strip of film by cutting or stamping.

20. The process according to claim 18, wherein applying the film comprises:

obtaining the film with a vacuum pipette; and locating the film over the recess while holding the film with the vacuum pipette.

21. The process according to claim 18, further comprising attaching the housing to a substrate after the film has been applied.

22. The process according to claim 21, wherein the substrate includes a circuit board.

23. The process according to previous claim 21, wherein the housing is applied to the substrate by reflow-soldering.

24. The process according to claim 18, further comprising removing the film from the housing before operating the optoelectronic component.

25. The device according to claim 2, wherein the housing has a surface surrounding the recess and the adhesive layer is applied to the surface.

26. The device according to claim 2, wherein the adhesive layer allows gases to flow into or out of the cavity.

27. The device according to claim 1, wherein the component is not in direct mechanical contact with the film.

28. The device according to claim 1, wherein the recess has at least sections of reflective areas.

29. The device according to claim 1, wherein the cavity is not hermetically sealed.

30. The device according to claim 1, wherein the film is birefringent.

31. An electronic device, comprising:

a housing having a recess containing an optoelectronic component; and a film including a polyimide over the recess at least partially enclosing the optoelectronic component between the film and the housing, wherein the polyimide is a poly-(diphenyloxide-pyromellithimide).

32. An electronic device, comprising:

a housing having a recess containing an optoelectronic component; and a film including a polyimide applied over the recess to define a cavity in which the component is located and to at least partially enclose the optoelectronic component between the film and the housing, wherein the film is birefringent.

33. An electronic device, comprising:

a housing having a recess containing a vertical-cavity surface-emitting laser (VCSEL) diode; and a film including a polyimide applied over the recess to define a cavity in which the diode is located and to at least partially enclose the diode between the film and the housing, wherein the film including polyimide is a piece of a strip of film.

34. An electronic device, comprising:

a housing having a recess containing an optoelectronic component; and a film including a polyimide applied over the recess to define a cavity in which the component is located and to at least partially enclose the optoelectronic component between the film and the housing, wherein the film including the polyimide is a piece of a strip of film and the housing is made of a synthetic material and the recess has at least sections of reflective areas.

* * * * *

UNITED STATES PATENT AND TRADEMARK OFFICE
CERTIFICATE OF CORRECTION

PATENT NO. : 7,851,812 B2  Page 1 of 1
APPLICATION NO. : 11/678523
DATED : December 14, 2010
INVENTOR(S) : Martin Rudolf Behringer et al.

It is certified that error appears in the above-identified patent and that said Letters Patent is hereby corrected as shown below:

In Claim 33, column 8, line 25, after "including" insert -- the --.

Signed and Sealed this
Twenty-second Day of March, 2011

David J. Kappos
*Director of the United States Patent and Trademark Office*